United States Patent [19]

Voorman

[11] Patent Number: 4,914,408
[45] Date of Patent: Apr. 3, 1990

[54] ASYMMETRIC POLYPHASE FILTER

[75] Inventor: Johannes O. Voorman, Eindhoven, Netherlands

[73] Assignee: U.S. Philips Corporation, New York, N.Y.

[21] Appl. No.: 342,417

[22] Filed: Apr. 24, 1989

[30] Foreign Application Priority Data

Jun. 2, 1988 [NL] Netherlands ................... 8801412

[51] Int. Cl.$^4$ .................... H03H 7/02; H03H 11/04
[52] U.S. Cl. ................................ 333/167; 307/520; 455/306; 330/109
[58] Field of Search ............... 333/167, 168, 172, 181; 307/109, 110, 521, 520, 359; 330/291, 109; 455/109, 306, 307

[56] References Cited

U.S. PATENT DOCUMENTS 4,696,055  9/1987  Marshall .................. 307/521 X
4,723,318  2/1988  Marshall .................. 307/359 X

OTHER PUBLICATIONS

Gingell, "Single Sideband Modulation Using Sequence Asymmetric Polyphase Networks", Electrical Communication, vol. 48, No. 1 and 2, 1973, pp. 21–25.

Primary Examiner—Eugene R. LaRoche
Assistant Examiner—Seung Ham
Attorney, Agent, or Firm—Edward W. Goodman

[57] ABSTRACT

Asymmetric polyphase filer having first to fourth input terminals for applying thereto a 4-phase input signal including first to fourth signal vectors, respectively, which succeed one another in phase each time through 90°, first to fourth intercoupled identical filter sections, respectively, connected to the terminals, at least one of the odd and even filter sections being coupled to two output terminals, said filter sections having constant reactances. To provide the possibility of an integrable realization of an asymmetrical filter transfer characteristic which is highly insensitive to component variations, the first and third filter sections and the second and fourth filter sections constitute a balanced in-phase and a balanced quadrature filter section circuit, respectively, in which the mutually corresponding reactances of the first and third filter sections and those of the second and fourth filter sections are constituted by active balanced integrators each having a balanced input terminal pair and output terminal pair with a balanced amplifier stage arranged therebetween, the output terminal pair being fed back to the input terminal pair via two mutually equal capacitances couplings being provided between the ouptut terminal pair of each of the integrators of the in-phase filter section circuit via two mutually equal resistors to the input terminal pair of the corresponding integrator of the quadrature filter section circuit, and conversely, which couplings are pairwise anti-reciprocal with respect to one another.

3 Claims, 7 Drawing Sheets

ASYMMETRIC POLYPHASE FILTER

BACKGROUND OF THE INVENTION

1. Field of the Invention

The invention relates to an asymmetric polyphase filter comprising first to fourth input terminals for applying thereto a 4-phase input signal comprising first to fourth signal vectors, respectively, which succeed one another in phase each time through 90°, first to fourth intercoupled identical filter sections, respectively, connected to said terminals, at least one of the odd and even filter sections being coupled to two output terminals, said filter sections having constant reactances.

2. Description of Related Art

Such an asymmetric polyphase filter is known from the Article "Asymmetric Polyphase Networks" by M. J. Gingell, published in "Electrical Communication", Vol. 48, no. 1 and 2, 1973, pp. 21-25.

The known polyphase filter has an N number of mutually identical filter sections which are incorporated between an N number of inputs and an N number of outputs. The filter sections are interconnected at certain points and constitute a physically symmetrical network, i.e. the electrical paths from each input to the corresponding output are mutually identical. A polyphase or N-phase input signal is applied to the inputs of the polyphase filter, which signal, if for example N=4, may consist of four signal voltages of mutually equal value jointly constituting a signal vector group whose four signal vectors succeed one another in a given direction of rotation through phase angles of 90° each. Dependent on this direction of rotation—counter-clockwise or clockwise—the frequency of the polyphase signal is positive or negative, or conversely. The asymmetric polyphase filter has an asymmetrical frequency transfer characteristic $H(\omega)$, i.e. the filter transfer for negative frequency values ($\omega<0$) of the polyphase input signal deviates from that for positive frequency values ($\omega>0$). To this end each filter part has one or more constant reactances, i.e. positive or negative frequency-independent imaginary conductances. To eliminate restrictions in the possibility of choosing the shape of the asymmetrical frequency transfer characteristic to a maximum possible extent, each of these constant reactances is realized by means of an N-port gyrator. However, this leads to a comparatively complex circuit configuration which is difficult to realize in a circuit symmetry which is sufficiently accurate for a correct filter operation.

SUMMARY OF THE INVENTION

It is an object of the invention to provide an active asymmetric four-phase polyphase filter in a symmetrical circuit configuration which can easily be integrated and whose transfer characteristic is comparatively insensitive to component variations.

According to the invention, an asymmetric polyphase filter of the type described in the opening paragraph is therefore characterized in that the first and third filter sections and the second and fourth filter sections constitute a balanced in-phase and a balanced quadrature filter section circuit, respectively, in which the mutually corresponding reactances of the first and third filter sections and those of the second and fourth filter sections are constituted by active balanced integrators each having a balanced input terminal pair and output terminal pair with a balanced amplifier stage arranged therebetween, said output terminal pair being fed back to the input terminal pair via two mutually equal capacitances, couplings being provided between the output terminal pair of each of the integrators of the in-phase filter section circuit via two mutually equal resistors to the input terminal pair of the corresponding integrator of the quadrature filter section circuit, and conversely, which couplings are pairwise anti-reciprocal with respect to one another.

It is known per se, for example from European Patent Application 185,417, to reduce the sensitivity of the filter to inquality of the components of the filter sections by means a feedstock from the output to the input of the polyphase filter.

The invention is based on the recognition that such a filter feedback can be obviated by realizing the constant reactances of the polyphase filter by means of anti-reciprocally coupled active balanced integrators.

When using the measure according to the invention, a simple application of active balanced integrators is made possible by said balancing between the first and the third filter sections and between the second and the fourth filter sections. Each active balanced integrator can be integrated in a simple manner and realizes at least two pairs of constant reactances so that a considerably smaller number of components is required as compared with the first-mentioned known polyphase filter in which a 4-port gyrator is required for each reactance for N=4. Due to the balancing these reactances realized by each integrator can be made accurately equal to one another and normally occurring component variations hardly have any influence on the filter transfer characteristic.

A preferred embodiment of such an asymmetric polyphase filter having a bandpass characteristic which is symmetrical with respect to the central frequency of the passband is characterized in that the two capacitances of each of the active balanced integrators are shunted by a pair of constant reactances each having a value which is equal to the product of the value of the capacitance shunted by each of these reactances and the central resonance frequency of the passband of the filter, the two reactances being constituted by a pair of resistors arranged between the balanced outputs of the corresponding integrators in the quadrature filter section circuit and the balanced inputs of the integrator in the in-phase filter section circuit, and conversely.

When using this measure, it is simply possible to choose the passband of the polyphase filter in accordance with the invention around a central resonance frequency of a desired value while maintaining symmetry of the filter characteristic around this desired central resonance frequency.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Generally, the transfer of four-phase polyphase filters, also referred to as quadrature filters, can be laid down by the following pair of equations for two-port networks:

$$Y1(j\omega) = H11(j\omega)X1(j\omega) + H12(j\omega)X2(j\omega) \quad (1)$$

$$Y2(j\omega) = H21(j\omega)X1(j\omega) + H22(j\omega)X2(j\omega) \quad (2)$$

Quadrature input signals for which it holds that: $X2(j\omega) = jX1(j\omega)$ are applied to the filter. If $$H12(j\omega) + H21(j\omega) = j(H11j\omega) - H22(j\omega)) \quad (3)$$

the output signals $Y1(j\omega)$ and $Y2(j\omega)$ are also in quadrature, i.e. $Y2(j\omega) = jY1(j\omega)$ and $$|Y1(j\omega)| = |Y2(j\omega)|.$$

Equation (3) is satisfied if $$H11(j\omega) = H22(j\omega)$$

and $$H12(j\omega) = -H21(j\omega)$$

It follows that (1) and (2) can be written as $$Y1(j\omega) = HQ(j\omega).X1(j\omega)$$

$$Y2(j\omega) = HQ(j\omega).X2(j\omega) \text{ with}$$
$$HQ(j\omega) = H11(j\omega) + H12(j\omega)$$

$HQ(j\omega)$ or $HQ(p)$ in Laplace notation represents the transfer function of a non-symmetric filter and has polynomials with complex coefficients.

The following arithmetical examples have been given on the basis of standardized values and dimensions (Q, F, H and Hz or rad/sec) and serve the sole purpose of explanation of the invention.

Figure 1A:
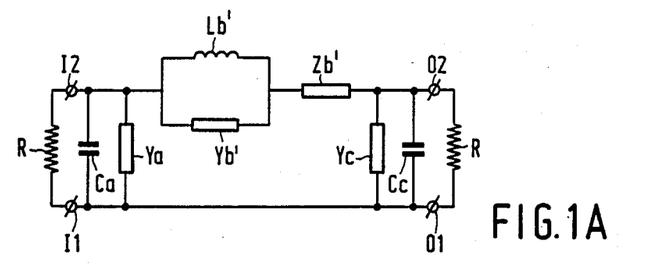
FIGS. 1A–1F are graphic representations of a single filter section circuit of a simple third-order asymmetric polyphase filter.

FIG. 1A shows a loss-free third-order non-symmetric filter circuit with input terminals I1 and I2 and output terminals O1 and O2 which are terminated by means of identical resistors R. The filter has a π-shaped circuit configuration with interconnected terminal I1 and O1; in the shunt branch at the input side between I1 and I2, a parallel circuit of a capacitance Ca and an imaginary conductance Ya, in the series branch, a parallel circuit of an inductance Lb' and an imaginary conductance Yb', which parallel circuit is arranged in series with an imaginary resistor Zb'; and in the shunt branch at the output side between O1 and O2, a parallel circuit of a capacitance Cc and an imaginary conductance Yc. The filter circuit shown has a transfer function $HQ(j\omega)$ for which it holds that:

$$|HQ(j\omega)|^2 = \frac{1}{1 + K^2(\omega - 4)^2(\omega - 5)^2(\omega - 6)^2/(\omega + 5)^2} \quad (4)$$

The transfer is 1 at a maximum which is reached for the frequencies $\omega = 4$, $\omega = 5$ and $\omega = 6$. The filter gives an infinite attenuation for $\omega = -5$ (rad/sec). K is a real constant, for example 10 and determines the ripple. The filter circuit shown results from a filter synthesis in accordance with the so-called Darlington ladder synthesis method, starting from (4) and the availability of imaginary conductances. Use is made of the results as are known from the Article "An extension to the concept of scattering matrix" published by Youla in IEEE Transactions CT-11, 1964, pp. 310–312. As is known, (4) can be written as $(HQ(p).HQ^*(-p^*))_{p=j\omega}$ in which $HQ(p)$ has a zero for $p = -5j$ while all poles are located in the left half-plane of the complex p-plane. Arithmetically, the poles follow from the equation $p + 5j = +/-jK(p - 4j)(p - 5j)(p - 6j)$, resulting in: $p1 = -0.6183 + j.4.97152$; $p2 = -0.31041 + j.3.85278$; $p3 = -0.37142 + j.6.17570$ which are located in the left half-plane. To obtain a loss-free two-port network which is resistively terminated at the input and output sides, it should hold that $|HQ(j\omega)|^2 = |S21(j\omega)|^2 = 1 - |S11(j\omega)|^2$ so that $$|S11(j\omega)|^2 = \frac{K^2(\omega - 4)^2(\omega - 5)^2(\omega - 6)^2}{(\omega + 5)^2 + K^2(\omega - 4)^2(\omega - 5)^2(\omega - 6)^2}$$

$S11(p)$ has zeros at $p4 = j4$, $p5 = j5$ and $p6 = j6$ and poles at p1, p2 and p3. The input impedance $Z11(p)$ is equal to $$Z11(p) = R \cdot \frac{1 + S11(p)}{1 - S11(p)} = R \frac{DS11 + NS11}{DS11 - NS11},$$

in which DS11 is the numerator and NS11 is the denominator of $S11(p)$.

If R is chosen to be 1, it can be derived therefrom that in the circuit of FIG. 1A:

| Ca = 1.466638 | Lb' = 3.685794 | Zb' = −j.9.131083 | Cc = 1.466638 |
|---|---|---|---|
| Ya = −j.7.291416 | Yb = −j0.05262 | Yc = j.7.291416 | |

Figure 1B:
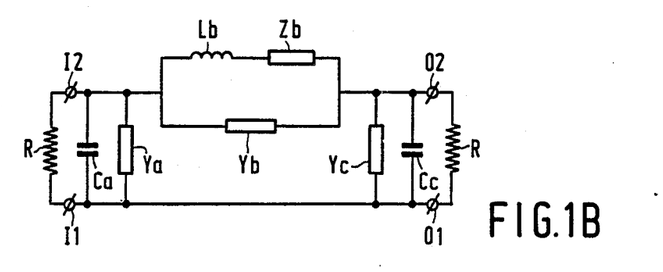

The equivalent circuit of FIG. 1B is obtained by replacing the series arrangement of Zb' with the parallel arrangement of Lb' and Yb' by a parallel arrangement of an imaginary conductance Yb with a series arrangement of an inductance Lb and an imaginary resistor Zb. The other components in this FIG. 1B are equal to the correspondingly denoted components of FIG. 1A.

As is known per se from the Article "Analog integrated filters or continuous-time filters for LSI and VLSI" by J. O. Voorman, published in Revue de Physique Appliquée 22 (1987), pp. 3-14, the "floating" imaginary conductance Yb can be replaced by two mutually equal, grounded imaginary transconductances Yb as is shown in the equivalent circuit of FIG. 1C. In this Figure the elements whose functions correspond to those of FIG. 1B have the same references.

Figures 1C, 1D:
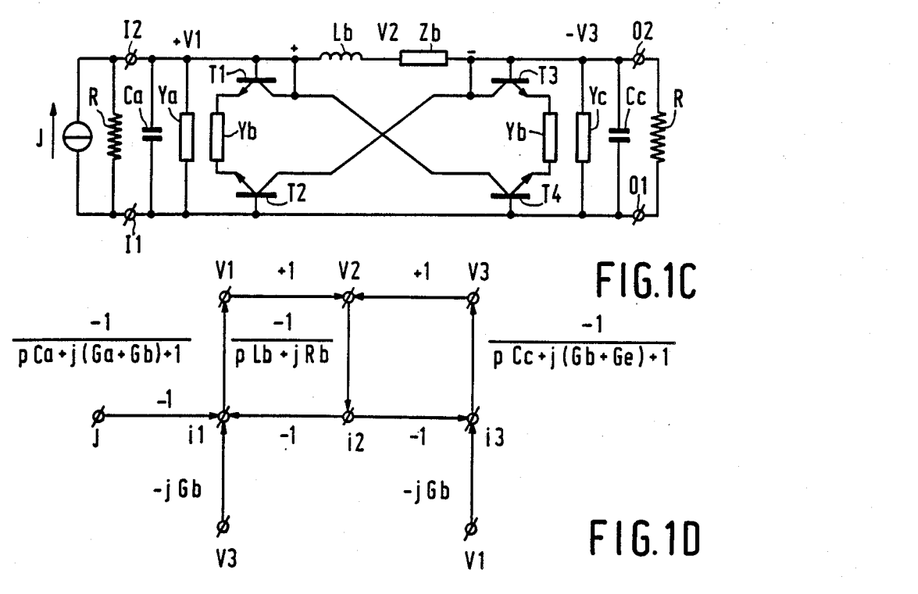

The ends of each of the transconductances Yb are arranged between the emitters of two transistors T1, T2 and T3, T4 considered to be ideal. The base electrodes of transistors T1 and T3 are connected on either side of the series arrangement of LB and Zb, while the base electrodes of the transistors T2 and T4 are connected to the common connection between the terminals I1 and O1. The collectors of T1 and T4 and those of T2 and T3 are connected in common to the bases of T1 and T3, respectively.

A subsequent step in the filter synthesis is obtained by means of the signal flow graph shown in FIG. 1D of the filter shown in FIG. 1C. The Figure is a graphic representation of the magnitude and direction or polarity of currents and voltages in the branches and at nodes in the filter of FIG. 1C. V1 denotes the voltage between terminal I2 and terminal I1, V2 denotes the voltage between terminal I2 and terminal O2, V3 denotes the voltage between terminal O1 and terminal O2. The reference i1 denotes the current from terminal I1 to terminal I2 through the input resistor R, Ca, Ya and the left-hand Yb combined, i2 denotes the current from terminal O2 to terminal I2 through Lb and Zb, i3 denotes the current from terminal O2 to terminal O1 through the terminal resistor R, Cc, Yc and the right-hand Yb combined.

Figure 1E:
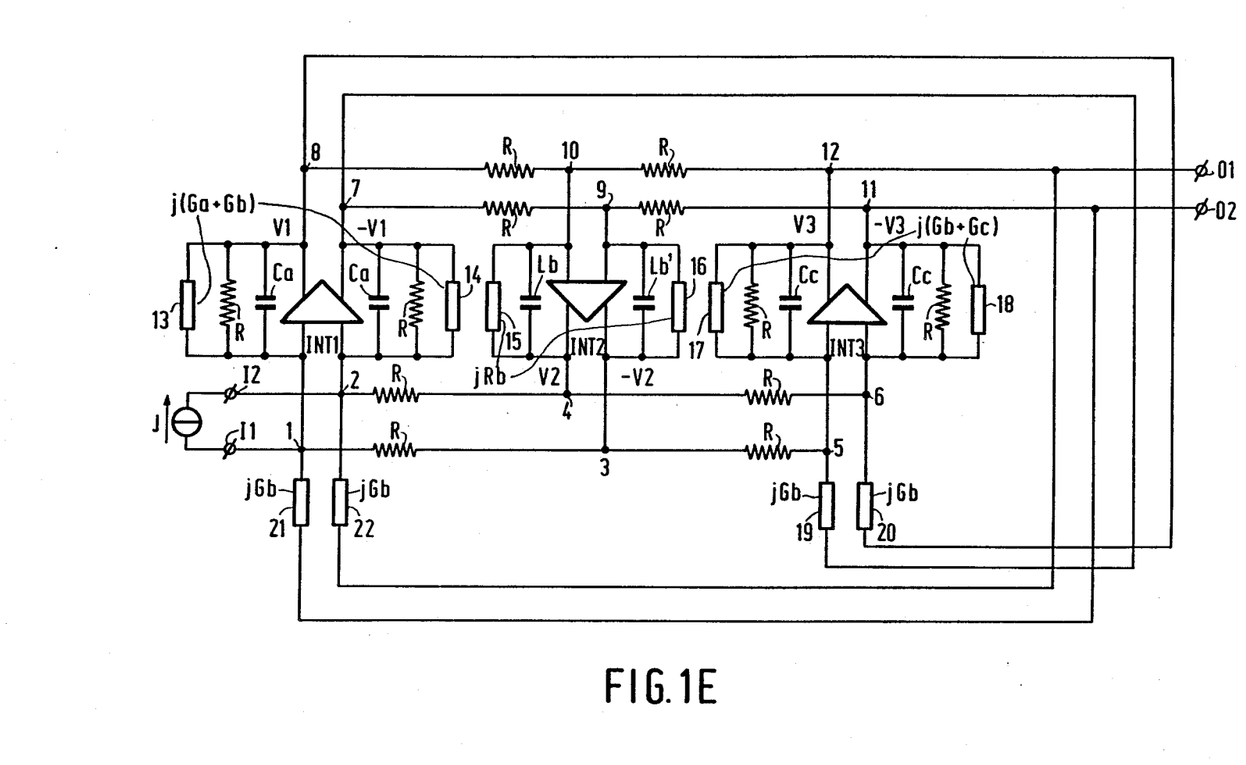

A realization by means of balanced integrators and constant reactances can be derived from this signal flow graph in a manner known per se, for example from the last-mentioned Article. Such a realization is shown in FIG. 1E and forms a balanced filter section circuit which is used in duplicate in the ultimate embodiment of the polyphase filter according to the invention to be described hereinafter. The balanced filter section circuit shown in FIG. 1E has a balanced input I1, I2 between which a signal current source J is arranged and to which a first pair of balanced series branches is coupled, each series branch including two identical series resistors R incorporated between nodes 1, 3 and 5 and 2, 4 and 6, respectively, the nodes 1 and 2 being connected to the input terminals I1 and I2, respectively. The filter section circuit shown also has a balanced output O1, O2 which is coupled to a second pair of balanced series branches each with two identical series resistors R incorporated between nodes 7, 9 and 11 and 8, 10 and 12, respectively, the nodes 11 and 12 being connected to the output terminals O1 and O2. In the signal direction between the nodes 1, 2; 9, 10 and 5, 6, on the one hand, and the nodes 7, 8; 3, 4 and 11, 12, on the other hand, there are arranged balanced integrators INT1, INT2 and INT3, respectively, each comprising a balanced operational amplifier fed back from positive output to negative input and from negative output to positive input via two identical capacitances Ca and Lb and Cc, respectively. Arranged in parallel with each of the two capacitances Ca and Cc of INT1 and INT3, respectively, is a resistor R representing the terminal resistor R at the input I1, I2 and the output O1, O2, respectively corresponding to the terminal resistors R as shown in FIGS. 1A-1C. Moreover, the operational amplifiers of INT1, INT2, INT3 are fed back via constant reactances 13, 14; 15, 16 and 17, 18, respectively. Furthermore, the balanced outputs of INT1 at the nodes 8, 7 and those of INT3 at the nodes 12, 11 are coupled to the balanced input of INT3 at the nodes 6, 5 and to those of INT1 at the nodes 2, 1, respectively via identical constant reactances 20, 19 and 22, 21, respectively.

Figure 1F:
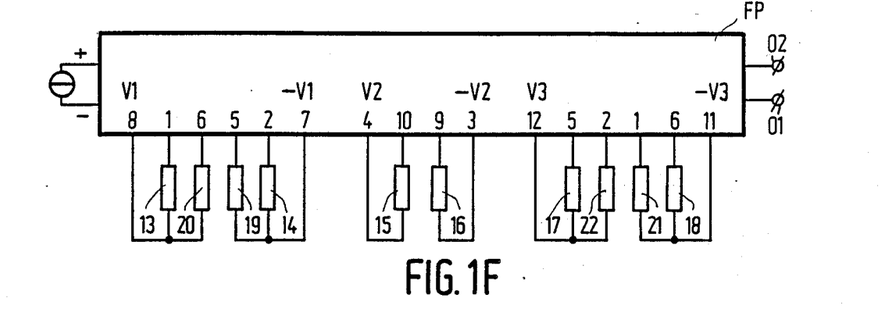

The filter section circuit of FIG. 1E formed with the balanced integrators INT1-3 and the constant reactances has the same filter transfer as each of the filter circuits of FIGS. 1A-1C and is shown as a block FP in FIG. 1F in which the section of the filter section circuit constituted by the real, i.e. non-imaginary components is incorporated having the imaginary reactances 13-22 coupled thereto via the terminals shown. The reference numerals of these terminals also refer to the nodes to which they are connected.

Figure 1G:
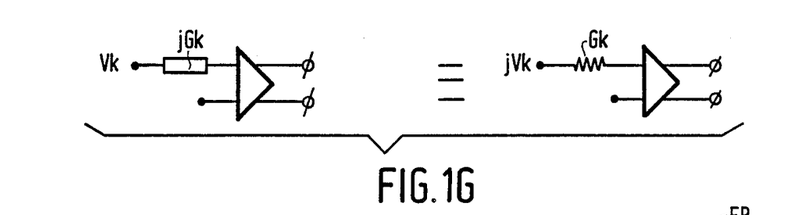
FIG. 1G shows equivalent realizations of a constant reactance.

FIG. 1G shows an equivalent circuit for a constant reactance incorporated in an input lead of an operational amplifier, to which reactances a real node voltage Vk is applied. The equivalent circuit has a real conductance or resistance incorporated in an input lead of an operational amplifier to which conductance or resistance an imaginary node voltage jVk or a node voltage which is in phase quadrature with respect to the node voltage Vk is applied.

Figure 1H:
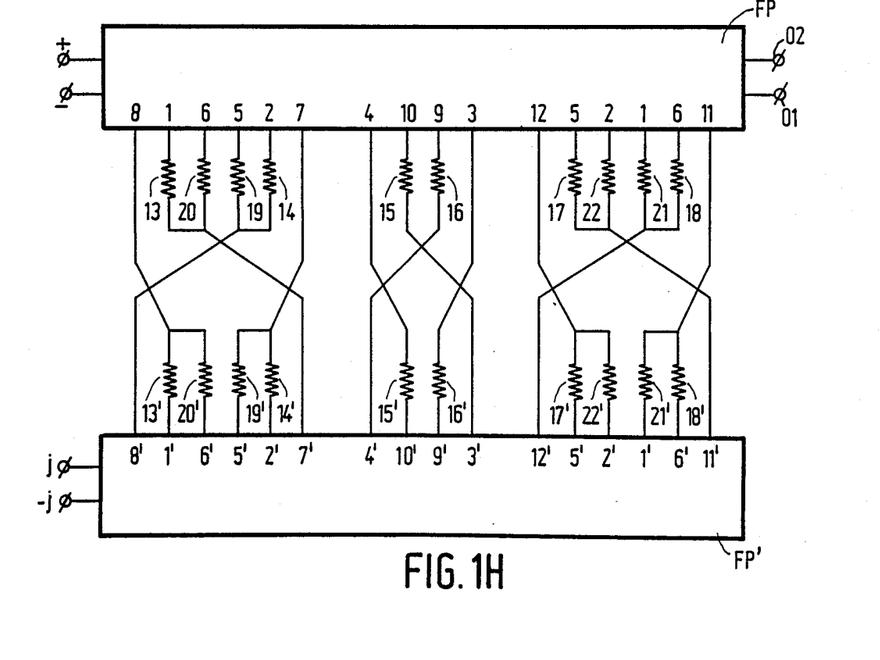
FIG. 1H shows the complete third-order asymmetric polyphase filter.

Using this equivalence, the polyphase filter according to the invention is realized without constant reactances by means of a filter section circuit of FIGS. 1E and 1F, hereinafter referred to as first filter section circuit FP, which is identical to a second filter section circuit FP' to which a balanced input signal is applied which is in phase quadrature with respect to the balanced input signal of the first filter section circuit. This is shown in FIG. 1H. Due to the identical current configuration and values of the elements—in FP' with a primed notation—of the first and second balanced filter section circuits FP and FP', the node voltages at the terminals 3, 4, 7, 8, 11 and 12 of FP are in phase quadrature with respect to those at the corresponding terminals 3', 4', 7', 8', 11' and 12' of FP'. Consequently, the imaginary reactances 13-22 of FP and the corresponding imaginary reactances 13'-22' of FP' can be realized by means of real resistors to which a voltage which is imaginary for the relevant filter section circuit is applied.

To this end resistors 13 and 20; 14 and 19; 15; 16; 17 and 22; 18 and 21 of the first balanced filter section circuit FP are therefore coupled in the polyphase filter shown to the terminals 7'; 8'; 3'; 4'; 11'; 12', respectively, of the second balanced filter section circuit FP' and resistors 13' and 20'; 14' and 19'; 15'; 16'; 17' and 22'; 18' and 21' of the second balanced filter section circuit FP' are coupled to the terminals 8; 7; 4; 3; 12; 11, respectively, of the first balanced filter section circuit FP. As a result, couplings are realized from the output terminal pair of the respective integrators INT1-3 of FP via two identical resistors to the input terminal pair of the respective corresponding integrators INT1'-3' of FP', and conversely, which couplings are pairwise anti-reciprocal with respect to one another. In other words, the coupling from the outputs of integrator INT1 to the inputs of integrator INT1' is anti-reciprocal with respect to the coupling from the outputs of integrator INT1' to the inputs of integrator INT1, etc.

Figure 1I:
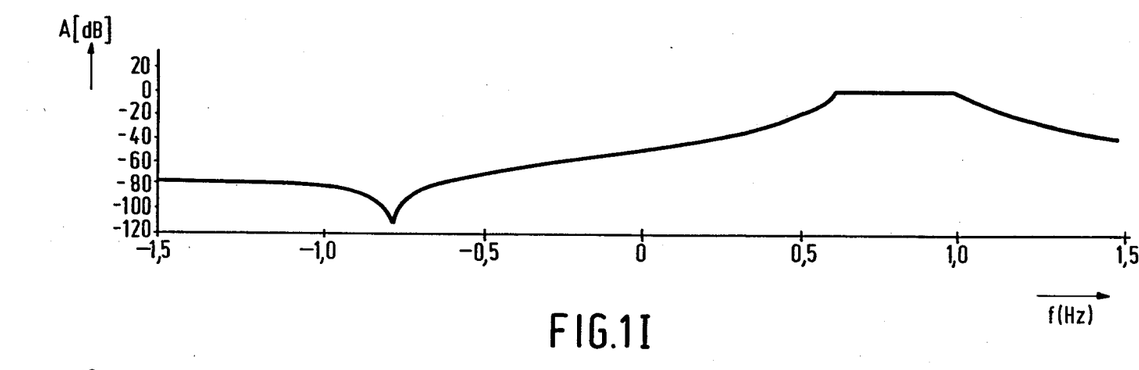
FIGS. 1I and 1J show the frequency-dependent amplitude and phase characteristics, respectively, of the polyphase filter of FIG. 1H.

FIG. 1I shows the amplitude characteristic of the asymmetric polyphase filter of FIG. 1H with elements of FP and FP' of the following standardized values:

| | | |
|---|---|---|
| Ca, Ca', Cc, Cc': | 1.466638 | R = R' = 1 |
| Lb, Lb': | 0.938204 | |
| 13, 13', 14, 14', 17, 17', 18, 18': | 7.345678 | |
| 15, 15', 16, 16': | 4.606865 | |
| 19, 19', 20, 20', 21, 21', 22, 22': | 0.107551 | |

This amplitude characteristic is asymmetrical with respect to the frequency zero value and has an attenuation for negative frequencies which is larger than for positive frequencies.

Figure 1J:
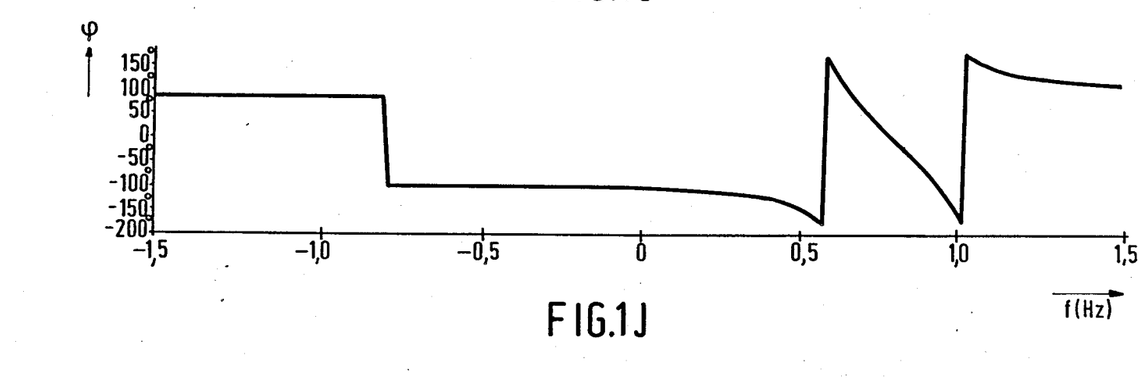

FIG. 1J shows the phase characteristic of the asymmetric polyphase filter of FIG. 1H which is substantially frequency-independent in the negative frequency range, with the exception of a 180° phase jump at the frequency $\omega=5$ (rad/sec), i.e. $f=-5/(2\pi)$ Hz$=-0.796$ Hz and which varies strongly with the frequency in the positive frequency range, notably for frequencies of more than 0.5 Hz.

Figure 2A:
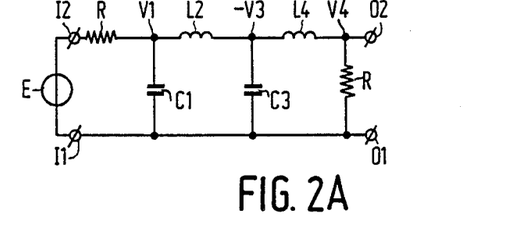
FIGS. 2A–2C are graphic representations of a filter section circuit comprising a fourth-order Butterworth low-pass filter.

FIG. 2A shows a fourth-order Butterworth low-pass filter with real elements comprising input and output terminals I1, I2 and O1, O2 between which a two-segment LC ladder network having identical source and load resistors R is arranged. The terminals I1 and O1 are connected to a common reference level and I2 is coupled via the source resistor R to a first LC ladder segment comprising a shunt capacitance C1 and a series inductance L2. The series inductance L2 is coupled to a second LC ladder segment comprising a shunt capacitance C3 and a series inductance L4 and is terminated by means of a load resistor R between L4 and and the reference level. The output terminals O1, O2 are connected on either side of the load resistor R.

Figure 2B:
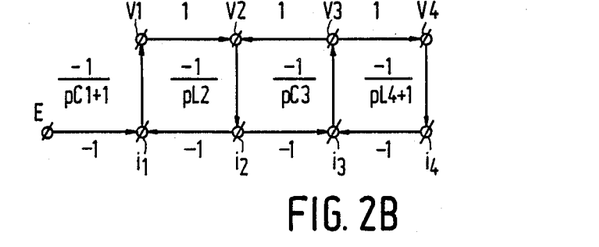
Figure 2C:
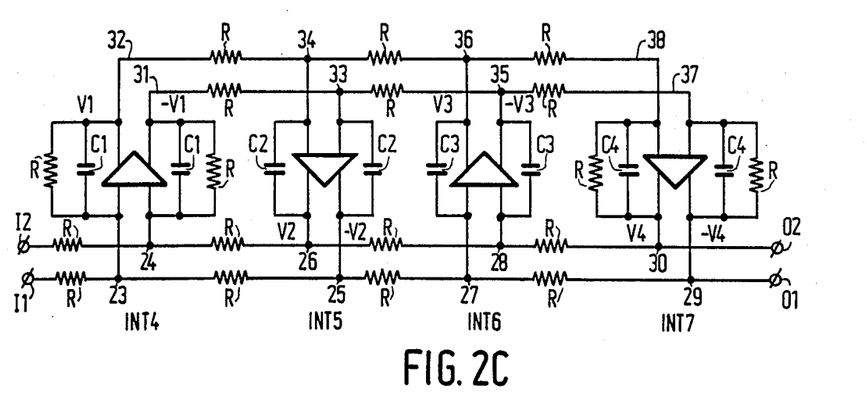
Figures 2D, 2H:
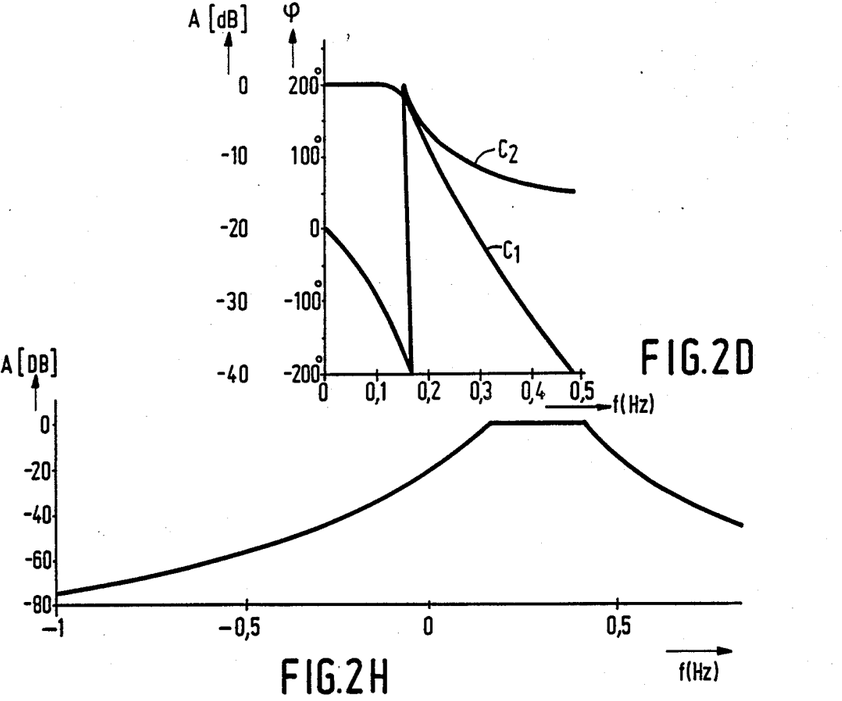
FIG. 2D shows the phase and amplitude characteristics of the filter of FIGS. 2A–2C.
FIGS. 2H and 2I show the frequency-dependent amplitude and phase characteristics, respectively, of the polyphase filter of FIG. 2G.

The low-pass amplitude and phase characteristic of the filter shown are denoted by curves c1 and c2, respectively, in FIG. 2D.

FIG. 2B shows the signal flow graph of the filter of FIG. 2A which is obtained in a manner known per se from the said Article by Voorman.

A filter realization with balanced integrators as is shown in FIG. 2C can be derived from this signal flow graph. As will be described hereinafter, this filter realization is used in duplicate in the ultimate embodiment of the polyphase filter and will therefore be further referred to as a balanced filter section circuit. The filter section circuit shown has a first pair of balanced series branches which are arranged between balanced input and output terminals I1, I2 and O1, O2, respectively, with each series branch including four identical series resistors R incorporated successively between I1 and nodes 23, 25, 27 and 29 in the one series branch and between I2 and nodes 24, 26, 28 and 30 in the other series branch. The nodes 29 and 30 are connected to the output terminals O1 and O2, respectively.

The filter section circuit also comprises a second pair of balanced series branches each comprising three identical series resistors R which are successively incorporating between nodes 31, 33, 35 and 37 in the one series branch and nodes 32, 34, 36 and 38 in the other series branch. Balanced integrators INT4-7 are arranged in the signal direction between the nodes 23, 24; 33, 34; 27, 28; 37, 38 and 30, 31; 25, 26; 35, 36; 29, 30, respectively. These integrators INT4-7 realize the transfer functions $-1/(pC+1)$, $-1/pL2$, $-1/pC3$ and $-1/(pL4+1)$ in the signal flow graph of FIG. 2B and to this end they comprise a balanced operational amplifier each, which is fed back from the negative and positive output terminals to the positive and negative input terminals, respectively via two identical capacitances C1-C4, respectively. The capacitances C2 and C4 fulfil the function of the inductances L2 and L4 of FIG. 2A and a resistor R is arranged parallel to each of the two capacitances C1 and C4 of INT1 and INT4, respectively. The resistors R of INT1 and of INT4 correspond to the source resistor R and the load resistor R, respectively, of FIG. 2A.

A frequency transposition of the filter characteristics of FIG. 2D can be obtained by replacing each capacitance in the low-pass filter of FIG. 2A by a parallel LC resonant circuit and by replacing each inductor by a series LC resonant circuit, i.e. by the transformation $p \rightarrow p + \omega_S^2/p$ in which $p=j\omega$ and $\omega_S$ is the central frequency of the bandpass region of the frequency-transposed low-pass filter. However, the bandpass filter thus obtained has the drawbacks of:

a non-symmetrical bandpass characteristic around $\omega = \omega_S$;

a mirror bandpass characteristic around $\omega = -\omega_S$;

a group transit time which deviates from that of the low-pass filter, i.e. for example a maximally flat group transit time does not remain maximally flat due to the frequency transformation.

Figure 2E:
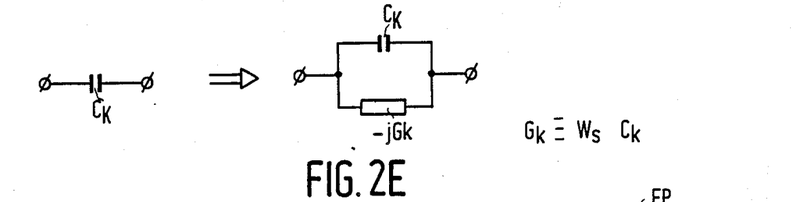
FIG. 2E shows diagrammatically a frequency transformation of each capacitance in the filter section circuit of FIG. 2C.

A frequency transposition which does not yield these drawbacks is obtained by the transformation $p \rightarrow p - j\omega_S$. This frequency transposition is obtained by the following substitution $pC_k \rightarrow (p=j\omega_S)C_k = pC_k - jG_k$ with $G_k = \omega_S C_k$. This means shunting each capacitance in the balanced filter section circuit of FIG. 2C, which is equivalent to the low-pass filter of FIG. 2A, with a constant reactance functioning as an imaginary conductance as is shown in FIG. 2E, in which the product of the value of the shunted capacitance and the central pass frequency is equal to the absolute value of the relevant constant reactance.

Figure 2F:
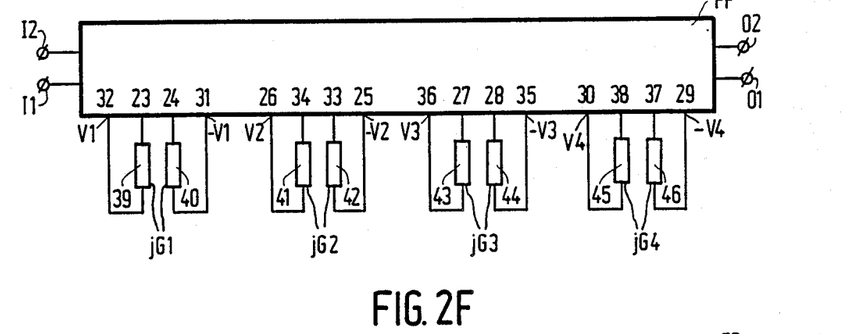
FIG. 2F shows the filter section circuit of FIG. 2C, transposed in a bandpass filter.

FIG. 2F shows the bandpass filter thus obtained. For the sake of clarity block FP denotes the balanced filter section circuit of FIG. 2C and constant reactances 39–46 with pairwise reactance values jG1–jG4, respectively are shown between the terminals 32, 33; 31, 24; 26, 34; 25, 33; 36, 27; 35, 28; 30, 38; 29, 37, respectively. The said terminals are connected to the nodes in FIG. 2C with the same reference numerals.

Figure 2G:
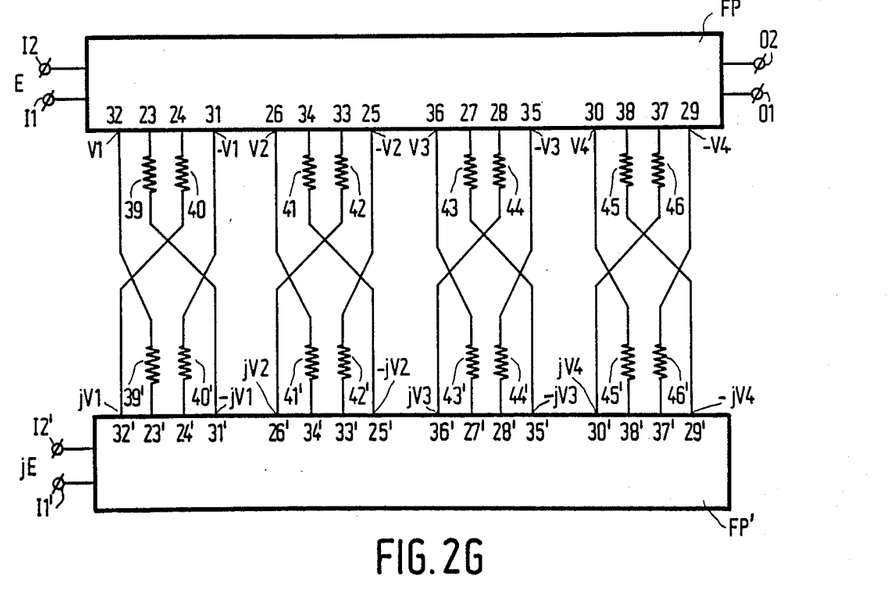
FIG. 2G shows the complete fourth-order asymmetric Butterworth polyphase filter.

A practical realization of the constant reactances 39–46 is obtained by means of the equivalence of FIG. 1G and is shown in FIG. 2G. The imaginary node voltages $jV_K$ are again obtained by using a second or quadrature filter section circuit FP' which is identical to the first or in-phase filter section circuit FP and whose element indications are primed. By applying signal voltages in a mutual phase quadrature to I1, I2 of FP and I1', I2' of FP' node voltages V1, $-$V1; V2, $-$V2; V3, $-$V3 and V4, $-$V4 are produced at the nodes 32, 31; 26, 25; 36, 35 and 30, 29, respectively, of FP, which voltages differ 90° in phase from the node voltages $jV1$, $-jV1$; $jV2$, $-jV2$; $jV3$, $-jV3$; $jV4$, $-jV4$ at the nodes 32', 31', 26', 25'; 36', 35'; and 30', 29' of FP'.

In the total bandpass polyphase filter of FIG. 2G the constant reactances jG1–jG4 are replaced by real resistors having the same reference indications as the corresponding constant reactances of FIG. 2F and are supplied with voltages from nodes of the other filter section circuit. The resistors 39–46 of FP are connected between the nodes 23, 24, 34, 33, 27, 28, 38 and 37 of FP and the nodes 31', 32', 25', 26', 35', 36', 29' and 30' of FP', respectively, and the resistors 39'–46' of FP' are connected between the nodes 23', 24', 34', 33', 27', 28', 38' and 37' of FP' and the nodes 32, 31, 26, 25, 36, 35, 30 and 29, respectively of FP. Via these pairwise identical resistors the output terminal pair of each of the integrators INT4–INT7 of the in-phase filter section circuit FP is coupled to the input terminal pair of the corresponding integrator of the quadrature filter section circuit FP', and conversely, which couplings are pairwise antireciprocal with respect to one another.

The filter characteristics shown in FIG. 2D were obtained by choosing the following standardized values for the elements in the low-pass filter of FIG. 2A: $R=1$; $C1=0.7654$; $L2=1.848$; $C3=1.848$; $L4=0.7654$. The standardized value 1 follows for the resistors R in FIG. 2C and the standardized values: 0.7654; 1.848; 1.848; 0.7654 follow for the capacitances C1–C4, respectively. A frequency transposition from $\omega_S=0$ to $\omega_S=2$ rad/sec ($f_s=0.318$ Hz) was obtained by means of the polyphase filter of FIG. 2G in which the resistors 39–46 as well as the resistors 39'–46' were chosen to be equal to the respective standardized values: 0.653, 0.654; 0.271; 0.271; 0.271; 0.271; 0.653; 0.653 Ohm.

Figure 2I:
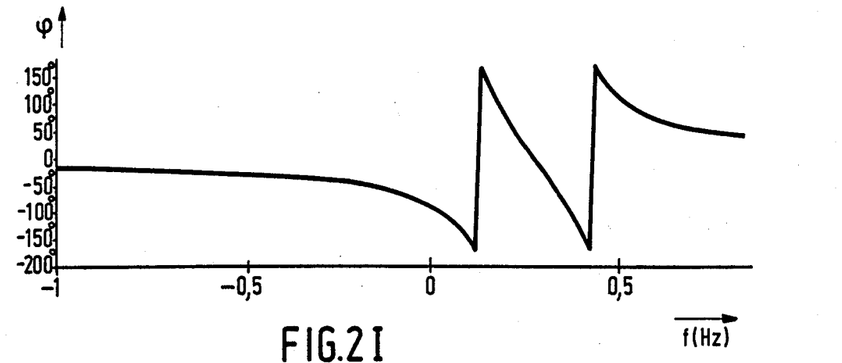

FIGS. 2H and 2I show the amplitude and phase characteristic of the last-mentioned polyphase filter. It can clearly be seen that the bandpass range only occurs for the positive frequency range while the group transit time which can be deduced from the phase characteristic does not deviate from that of the original low-pass filter as is shown in FIG. 2D.

It will be evident that the invention is not limited to the embodiments shown, but it can in principle be used for the realization of substantially any asymmetrical filter transfer function.

The asymmetric polyphase filters obtained by means of the invention can be easily integrated and are particularly advantageous when used in, for example quadrature receivers for the suppression of mirror frequencies and/or in demodulators.

I claim:

1. An asymmetric polyphase filter comprising first to fourth input terminals for applying thereto a 4-phase input signal comprising first to fourth signal vectors, respectively, which succeed one another in phase each time through 90°, first to fourth intercoupled identical filter sections, respectively, connected to said terminals, at least one of the odd and even filter sections being coupled to two output terminals, said filter sections having constant reactances, characterized in that the first and third filter sections and the second and fourth filter sections constitute a balanced in-phase and a balanced quadrature filter section circuit, respectively, in which the mutually corresponding reactances of the first and third filter sections and those of the second and fourth filter sections are constituted by active balanced integrators each having a balanced input terminal pair and output terminal pair with a balanced amplifier stage arranged therebetween, said output terminal pair being fed back to the input terminal pair via two mutually equal capacitances, couplings being provided between the output terminal pair of each of the integrators of the in-phase filter section circuit via two mutually equal resistors to the input terminal pair of the corresponding integrator of the quadrature filter section circuit, and conversely, which couplings are pairwise anti-reciprocal with respect to one another.

2. An asymmetric polyphase filter as claimed in claim 1, characterized by an asymmetrical bandpass characteristic, both capacitances of each of the active balanced integrators being shunted by a pair of constant reactances each having a value which is equal to the product of the value of the capacitance shunted by each of these reactances and the central resonance frequency of the passband of the filter, said two reactances being constituted by a pair of resistors arranged between the balanced outputs of the corresponding integrator in the quadrature filter section circuit and the balanced inputs of the integrator in the in-phase filter section circuit, and conversely.

3. An asymmetric polyphase filter as claimed in claim 1, characterized in that each of the two filter section circuits comprises first and second pairs of balanced series branches which are intercoupled at nodes separated by identical resistors via a number of pairs of balanced shunt branches, each pair of shunt branches comprising one of said integrators, said integrators being cascade arranged from the input to the output of the filter section circuit.

* * * * *